(12) United States Patent
Nagahara (10) Patent No.: US 10,861,770 B2
(45) Date of Patent: Dec. 8, 2020

(54) POWER MODULE AND SEMICONDUCTOR APPARATUS

(71) Applicant: Mitsubishi Electric Corporation, Tokyo (JP)

(72) Inventor: Teruaki Nagahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/132,504

(22) Filed: Sep. 17, 2018

(65) Prior Publication Data

US 2019/0252292 A1  Aug. 15, 2019

(30) Foreign Application Priority Data

Feb. 14, 2018 (JP) .................................. 2018-024101

(51) Int. Cl.
| | | |
|---|---|---|
| *H01L 23/40* | (2006.01) | |
| *H05K 7/14* | (2006.01) | |
| *H05K 7/20* | (2006.01) | |
| *H01L 23/28* | (2006.01) | |
| *H01L 23/049* | (2006.01) | |

(52) U.S. Cl.
CPC .......... *H01L 23/4006* (2013.01); *H01L 23/28* (2013.01); *H05K 7/1427* (2013.01); *H05K 7/209* (2013.01); *H05K 7/2089* (2013.01); *H01L 23/049* (2013.01); *H01L 2023/4018* (2013.01); *H01L 2023/4062* (2013.01); *H01L 2023/4087* (2013.01)

(58) Field of Classification Search
CPC combination set(s) only.
See application file for complete search history.

(56) References Cited

U.S. PATENT DOCUMENTS

| | | | |
|---|---|---|---|
| 2011/0266686 A1* | 11/2011 | Yamaguchi ......... | H01L 23/3107 257/773 |
| 2013/0187571 A1* | 7/2013 | Yeh ....................... | H01L 25/167 315/309 |
| 2017/0150640 A1 | 5/2017 | Yamanaka et al. | |

FOREIGN PATENT DOCUMENTS

| | | |
|---|---|---|
| JP | 2004-179492 A | 6/2004 |
| JP | 2013-016606 A | 1/2013 |
| JP | 2017-098329 A | 6/2017 |

OTHER PUBLICATIONS

An Office Action mailed by the German Patent Office dated Jun. 9, 2020, which corresponds to German Patent Application No. 10 2018 218 101.2 and is related to U.S. Appl. No. 16/132,504 with English translation.
An Office Action issued by the German Patent Office dated Oct. 13, 2020, which corresponds to German Patent Application No. 10 2018 218 101.2 and is related to U.S. Appl. No. 16/132,504.

* cited by examiner

*Primary Examiner* — Ratisha Mehta
(74) *Attorney, Agent, or Firm* — Studebaker & Brackett PC (57) ABSTRACT

Examples of a power module include a resin housing including a main body and at least one projection protruding from the main body, and a lead terminal extending outwardly from the main body, wherein a through-hole is provided so as to penetrate the main body and the projection protruding from the main body.

22 Claims, 8 Drawing Sheets

POWER MODULE AND SEMICONDUCTOR APPARATUS

BACKGROUND

Field

The present invention relates to a power module and a semiconductor apparatus.

Background Art

A power module used for inverter-driving a motor with a relatively small capacity often includes semiconductor devices such as IGBTs (insulated gate bipolar transistors) and diodes that are resin-molded, and external terminals that are DIP (dual in-line package) terminals or are arranged similarly to DIP terminals. In the case where such a power module is mounted on a circuit board, damage such as a crack to the molded resin by application of stress due to bending or deformation of the circuit board is prevented during mounting or use thereof after mounting. Specifically, the bottom surface of the power module package is lifted from the circuit board by stoppers positioned at an appropriate height of terminals, and in this state, the power module is fixed to the circuit board, for example, by soldering. As a result, the terminals act as springs, thereby reducing the stress.

In such a power module, heat needs to be dissipated. Typically, an external heat sink made of metal, such as aluminum, is fixed to the power module package by, e.g., screwing, to dissipate heat. Depending on the end use application, or mounting location of the power module, the circuit board may be subject to heavy vibrations. For example, when an inverter board is assembled into the housing of a washing machine or housings of various pumps, the inverter board is subject to vibrations. In that case, terminals of the power module may break due to excessive vibrations caused by resonance, depending on vibration frequencies.

In addition, when a heat sink is attached to a power module and then the resulting assembly is mounted to a housing of an apparatus, pressing or snagging the heat sink by an operator may lead to bending of the terminals. For this reason, the market demands firm fixation of a heat sink by bringing a package into contact with a circuit board, depending on the end use application.

Japanese Unexamined Patent Application Publication No. 2004-179492A discloses a technique for maintaining a predetermined spacing between a main body of a semiconductor apparatus and a PCB (printed circuit board).

SUMMARY

The following three methods are conceivable to firmly fix a heat sink by bringing a package into contact with a circuit board. However, each of the methods has problems.

(1) A size of a through-hole provided in a circuit board so as to allow a terminal to pass therethrough is enlarged so that a stopper provided on the terminal can pass therethrough. Thereafter, a package is brought into contact with the circuit board, and the circuit board, a power module, and a heat sink are fastened together by screwing. In this case, the enlargement of the through-hole makes soldering difficult, and a solder bridge may be formed between terminals by making a protrusion length of the terminals from the circuit board longer. Moreover, excessive stress is applied to an end portion of the package by solidly mounting the package on the circuit board, and therefore the package may be damaged.

(2) An exclusive power module that includes terminals without stoppers is developed. In this case, since a power module including stoppers and a power module without stoppers are provided, the lineup expands and therefore productivity may be lowered, and management costs may increase. Moreover, excessive stress is applied to an end portion of the package by solidly mounting the package on the circuit board, and therefore the package may be damaged.

(3) A stopper is used as-is, but a package is fixed to a circuit board while being lifted from the circuit board by inserting a spacer between the package and the circuit board. As the spacer, a resin such as plastic is used. In this case, the cost increases due to material costs of the spacer and man-hours to insert the spacer. For example, Japanese Unexamined Patent Application Publication No. 2004-179492A discloses inserting a spacer between a circuit board and a package main body. However, a specific structure of the spacer is not suggested therein. Provision of a spacer alone cannot prevent excessive stress acting on an end portion of a package from a circuit board.

As described above, it is required to firmly fixing a circuit board, heat sink, and a power module so as not to break terminals of the power module by vibrations during use or contact during assembling. However, by doing so as required, the package is damaged due to stress, i.e., warpage of the circuit board.

SUMMARY

The present invention has been achieved to solve the above-described problems and an object of the present invention is to provide a power module and a semiconductor apparatus that have high reliability.

In some examples, a power module includes a resin housing including a main body and at least one projection protruding from the main body, and a lead terminal extending outwardly from the main body, wherein a through-hole is provided so as to penetrate the main body and the projection.

In some examples a semiconductor apparatus includes a power module including a resin housing having a main body and a projection protruding from the main body, and a lead terminal extending outwardly from the main body, a through-hole being provided so as to penetrate the main body and the projection, and a printed circuit board including a substrate through-hole, the lead terminal passing through the substrate through-hole, wherein the projection is in contact with the printed circuit board.

Other and further objects, features and advantages of the invention will appear more fully from the following description.

DETAILED DESCRIPTION

A power module and a semiconductor apparatus according to some examples will be described with reference to drawings. Identical or corresponding components are provided with the same reference numerals throughout the drawings, and redundant description will be omitted.

First Embodiment

Figure 1:
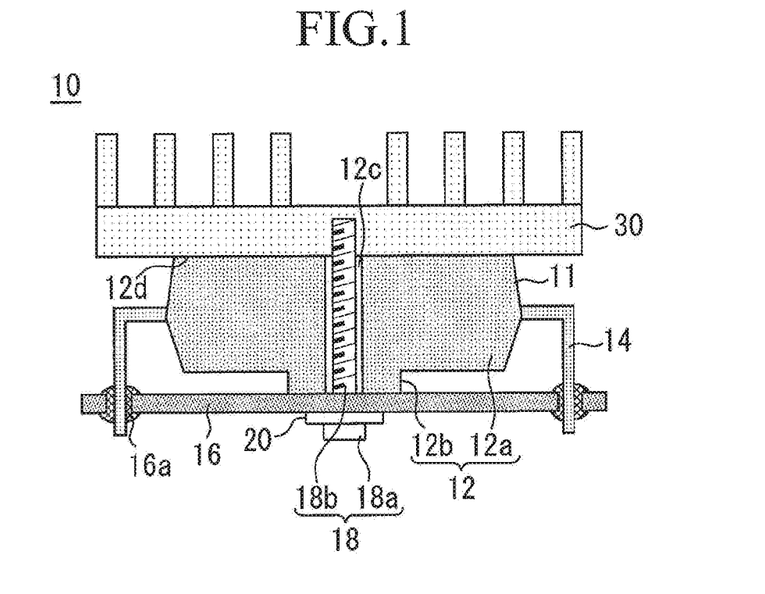
FIG. 1 is a cross-sectional view of a semiconductor apparatus according to a first embodiment.

FIG. 1 is a cross-sectional view of a semiconductor apparatus 10 according to a first embodiment. The semiconductor apparatus 10 includes a power module 11. The power module 11 has semiconductor devices such as IGBTs and diodes inside thereof. The semiconductor devices are covered with a resin housing 12. The resin housing 12 includes a main body 12a and a projection 12b. The main body 12a covers the semiconductor devices. The projection 12b protrudes from the main body 12a. The resin housing 12 is a package for the power module 11. Lead terminals 14 extend outwardly from the main body 12a. The lead terminals 14 are electrically connected to the semiconductor devices inside the main body 12a.

The projection 12b is in contact with a printed circuit board 16. Specifically, a bottom surface of the projection 12b is a flat surface, for example. The flat surface is brought into contact with the printed circuit board 16. The printed circuit board 16 includes substrate through-holes 16a through which the lead terminals 14 pass. The lead terminals 14 are connected to the printed circuit board 16 by a solder or an adhesive such as a conductive adhesive while being inserted to the substrate through-holes 16a. As a result, the lead terminals 14 are connected to a circuit pattern formed on the printed circuit board 16.

The resin housing 12 includes at least one through-hole 12c penetrating the main body 12a and the projection 12b. A heat sink 30 is located on the upper side of the though-hole 12c, whereas the printed circuit board 16 is located on the lower side thereof. The heat sink 30 is attached on an upper surface 12d of the resin housing 12, the upper surface 12d being opposite to a surface provided with the projection 12b. A shaft 18b of a screw 18 passes through a washer 20, the printed circuit board 16, and the through-hole 12c and is screwed into the heat sink 30, thereby bringing the upper surface 12d into close contact with the heat sink 30 and bringing the projection 12b into close contact with the printed circuit board 16. The washer 20 between a head 18a of the screw 18 and the printed circuit board 16 may be excluded.

Figure 2:
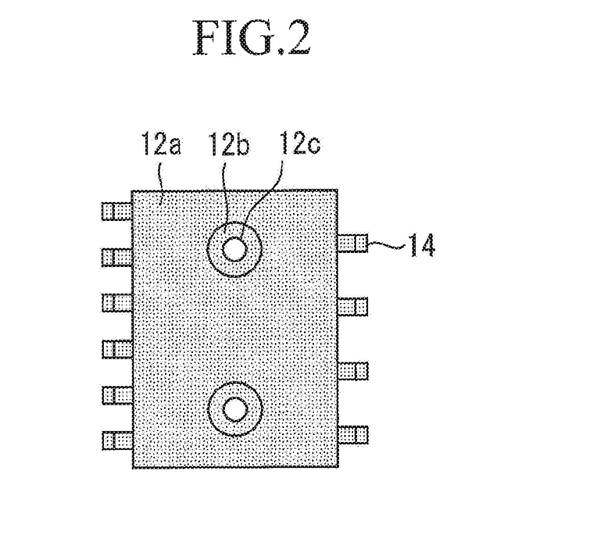
FIG. 2 is a bottom plan view of the power module.

FIG. 2 is a bottom plan view of the power module 11. Two projections 12b are provided. Each of the two projections 12b surrounds the corresponding through-hole 12c. The area of each projection 12b in a plan view may be sufficient if it is stably invulnerable to a force from the screw 18 and may be roughly equal to the area of the washer 20. The screw 18 is fastened while the bottom surface of each projection 12b is in contact with the printed circuit board 16, thereby making possible the close contact between the projections 12b and the printed circuit board 16. The projections 12b are required to be stably in contact with the printed circuit board 16, and examples of the planar shape of the projections 12b include, but are not limited to circle, square, and triangle.

Since the projections 12b of the power module 11 are in contact with the printed circuit board 16, the power module 11 and the semiconductor apparatus 10 according to the first embodiment have high reliability even in an environment in which vibrations occur, for example. Specifically, the degree of reliability is equivalent to that when the entire surface of a main body of a resin housing is solidly mounted on a printed circuit board.

In a case where a stopper is provided on a portion of each lead terminal, root of which is bent, so as to provide a gap between a power module and a printed circuit board using the stopper, height of the stopper is likely to vary among stoppers. On the other hand, in the semiconductor apparatus 10 according to the first embodiment, the projection 12b is provided to the resin housing 12 that is formed in a mold, for example. Accordingly, a distance between the main body 12a and the printed circuit board 16 can be easily controlled by adjusting the height of the projection 12b. As a result, it is possible to increase the assembling accuracy when an assembly to which the heat sink 30 has been attached is mounted to a case or the like, and also possible to enhance the solderability by increasing accuracy of protrusion lengths of the lead terminals 14 from the substrate through-holes 16a. In addition, the contact area between the projection 12b and the printed circuit board 16 is small compared to the contact area between the main body 12a and the printed circuit board 16 when the main body 12a is solidly mounted on the printed circuit board 16, thereby reducing the stress exerted on the power module 11 by the printed circuit board 16.

Figure 3:
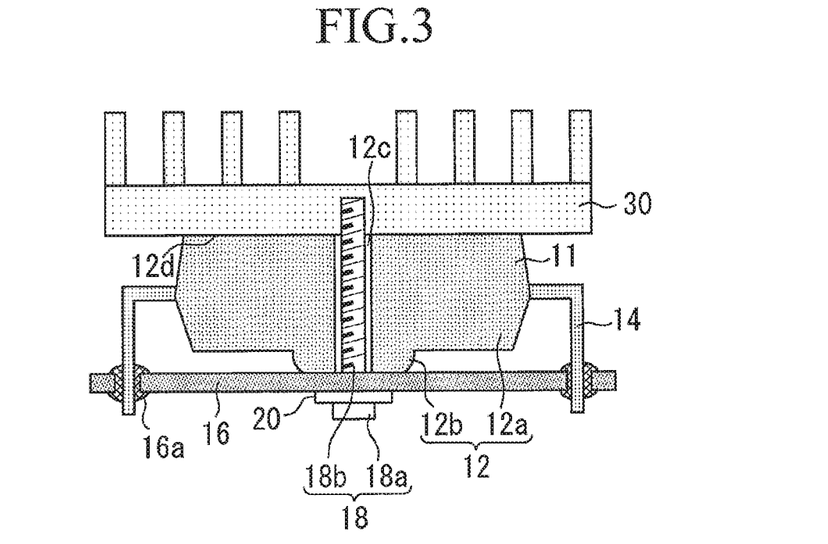
FIG. 3 is a cross-sectional view of a semiconductor apparatus according to a modification.

FIG. 3 is a cross-sectional view of a semiconductor apparatus according to a modification. A side surface of the projection 12b and a flat surface, i.e. a bottom surface, of the projection 12b are connected by a curved surface. In other words, each corner of the flat surface of the projection 12b is rounded or is chamfered so as not to make contact with the printed circuit board 16. With the shape of the projection 12b in FIG. 1, since the contact area between the projection 12b and the printed circuit board 16 is small, the stress exerted on the power module 11, for example, when the printed circuit board is warped is reduced. However, such stress can be further reduced by rounding each corner of the projection 12b as shown in FIG. 3. It should be noted that it is not necessary to differentiate the side surface, the curved surface, and the flat surface of the projection 12b, and the side surface and the flat surface may be a curved surface.

Figure 4:
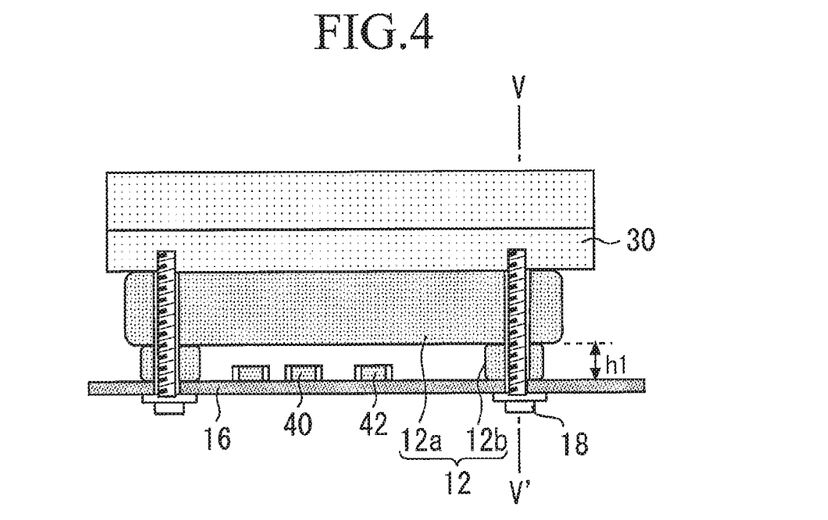
FIG. 4 is a cross-sectional view of a semiconductor apparatus according to another modification.
Figure 5:
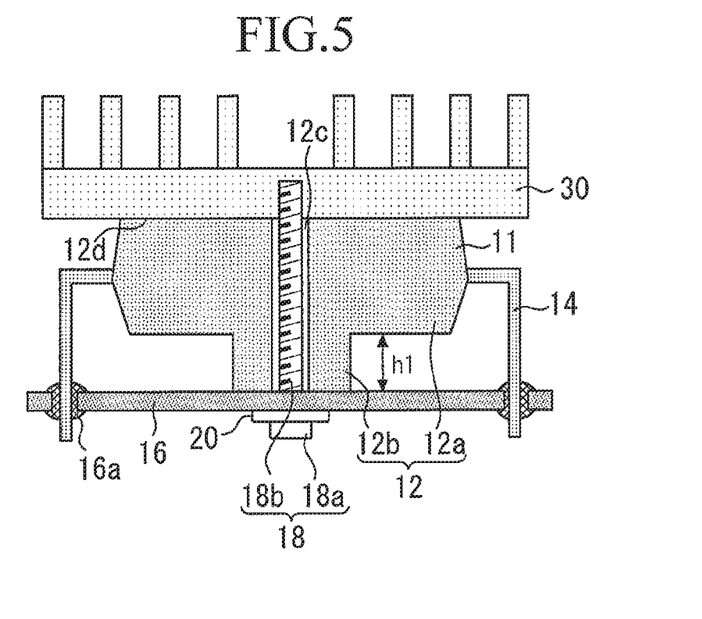
FIG. 5 is a cross-sectional view taken along line V-V' of the semiconductor apparatus of FIG. 4.

FIG. 4 is a cross-sectional view of a semiconductor apparatus according to another modification. The projections 12b protrude 1.5 to 2 mm or more relative to the main body 12a. That is, a length h1 in FIG. 4 is 1.5 to 2 mm or longer. FIG. 5 is a cross-sectional view taken along line V-V' of the semiconductor apparatus of FIG. 4. As shown in FIGS. 4 and 5, a large space is provided between the printed circuit board 16 and the main body 12a. Surface mount components with low height, such as a ceramic capacitor 40 and a chip resistor 42 can be arranged within the space, for example. By fixing the surface mount components on the printed circuit board 16 right under the power module 11, the area of the printed circuit board 16 is reduced compared to that when the surface mount components are positioned on an outer side of the printed circuit board 16 right under the power module 11, thereby reducing cost.

The modifications described in the first embodiment can be applied also to a power module and a semiconductor apparatus according to the following embodiments. It should be noted that the power module and the semiconductor apparatus according to the following embodiments share many common features with the first embodiment and therefore the differences from the first embodiment will be mainly described.

Second Embodiment

Figure 6:
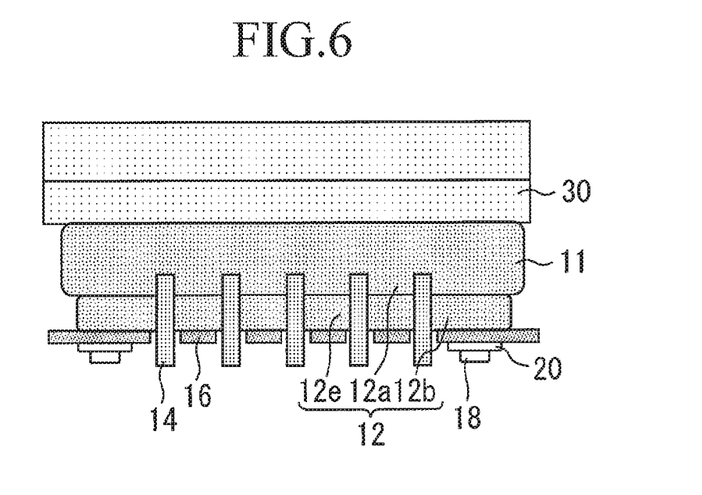
FIG. 6 is a side view of a semiconductor apparatus according to a second embodiment.
Figure 7:
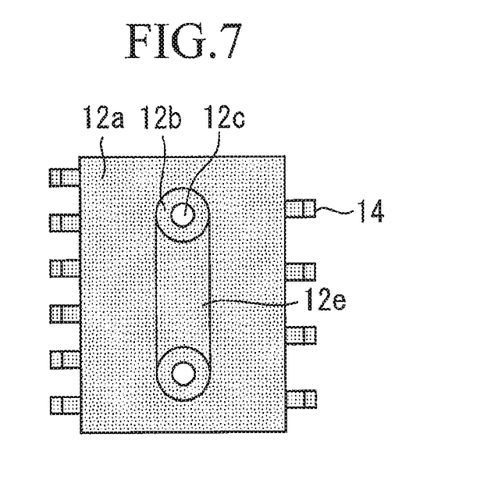
FIG. 7 is a bottom plan view of the power module of FIG. 6.

FIG. 6 is a side view of a semiconductor apparatus according to a second embodiment. Two projections 12b are provided. The resin housing 12 includes a connecting member 12e protruding from the main body 12a and connecting the two projections 12b. The amount of protrusion of the connecting member 12e from the main body 12a may be about the same as the amounts of protrusion of the projections 12b from the main body 12a. FIG. 7 is a bottom plan view of the power module 11 of FIG. 6. For example, a width of the connecting member 12e is about the same as widths of the projections 12b so that the area of the connecting member 12e is prevented from being excessively large.

For example, in a case where a power module has an elongated outer shape, if the power module 11 is fixed to the printed circuit board 16 by screwing at two points, a central part of the power module 11 may vibrate and resonate, thereby causing damage to the resin housing 12. Therefore, in the second embodiment, the connecting member 12e is provided on the central part to give a sufficient thickness. As a result, the amplitude of the vibrations is suppressed in at least one side thereof owing to the connecting member 12e serving as a stopper, thereby protecting the resin housing 12 from damage. Also, making the central part thicker increases rigidity of the resin housing 12, and therefore the power module 11 vibrates less.

Figure 8:
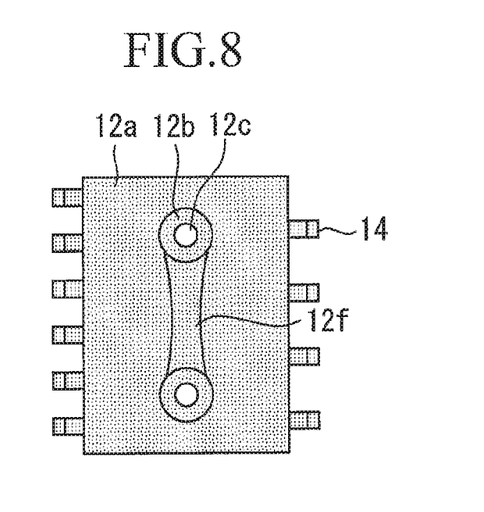
FIG. 8 illustrates a modification of a planar shape of a connecting member.

FIG. 8 illustrates a modification of a planar shape of a connecting member. A connecting member 12f has a recessed shape curving toward the inner side in planar view. That is, a side surface of the connecting member 12f is a curved surface. Since the connecting member 12f provided between the two projections 12b is recessed toward the inner side, it is possible to reduce the stress acting in a direction perpendicular to a line connecting the two through-holes 12c among the stress exerted on the connecting member 12f due to bending or the like of the printed circuit board 16 while maintaining the effect of enhancing the resistance to vibrations. Such an effect is achieved not only when the side surface of the connecting member is a curved surface but also when a width of the connecting member decreases as a distance from the projections 12b increases in planar view. In addition, if a side surface and a bottom surface of a connecting member are connected by a curved surface, it is possible to prevent damage to the power module 11 due to contact between a corner of the connecting member and the printed circuit board 16. It is preferable that each corners of the projections 12b, connecting members 12e, 12f be removed, that is, each corner thereof be rounded or chamfered.

Figure 9:
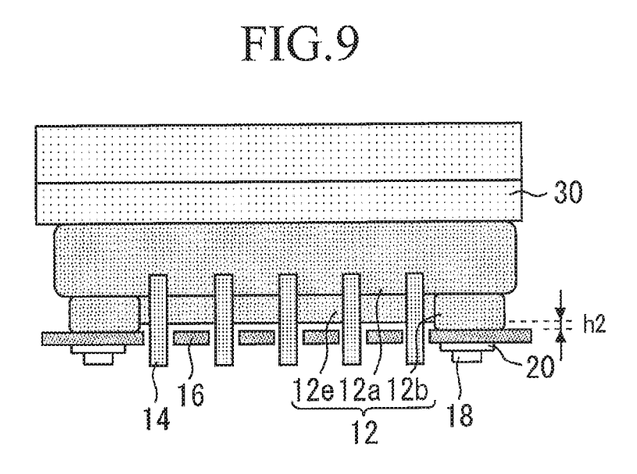
FIG. 9 is a side view of a semiconductor apparatus according to another modification.

FIG. 9 is a side view of a semiconductor apparatus according to another modification. The amount of protrusion of each of the projections 12b relative to the main body 12a is larger than the amount of protrusion of the connecting member 12e relative to the main body 12a. As a result, a difference of a length h2 is generated between the amounts of protrusion. The projections 12b make contact with the printed circuit board 16, whereas the connecting member 12e does not make contact with the printed circuit board 16. Doing so slightly increases the amplitude of vibrations compared to that in the configuration in FIG. 6, but an effect of suppressing the amplitude is achieved. Moreover, the stress generated due to warpage of the printed circuit board 16 does not act on the connecting member 12e but only on the projections 12b, thereby reducing the stress to which the power module 11 is subjected as is the case with the configuration of the first embodiment.

Figure 10:
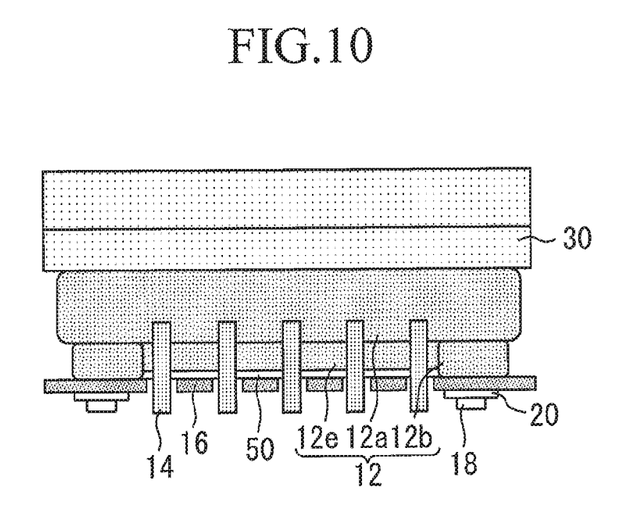
FIG. 10 illustrates that grease is added to the semiconductor apparatus.

FIG. 10 illustrates that grease is added to the semiconductor apparatus of FIG. 9. On the bottom surface of the connecting member 12e, grease 50 is provided. A material of the grease 50 is not particularly limited as long as it has an appropriate viscosity. The material of the grease 50 may be any material that has viscosity or elasticity, such as silicone grease. When the power module 11 vibrates in a direction away from the printed circuit board 16, since the grease 50 has viscosity, the movement of the power module 11 is limited. As a result, the amplitude of the vibrations is limited, thereby preventing damage to the resin housing 12 due to vibrations or resonance. It should be noted that the grease 50 may be provided between the main body 12a and the printed circuit board 16 in a configuration without the connecting member 12e.

Third Embodiment

Figure 11:
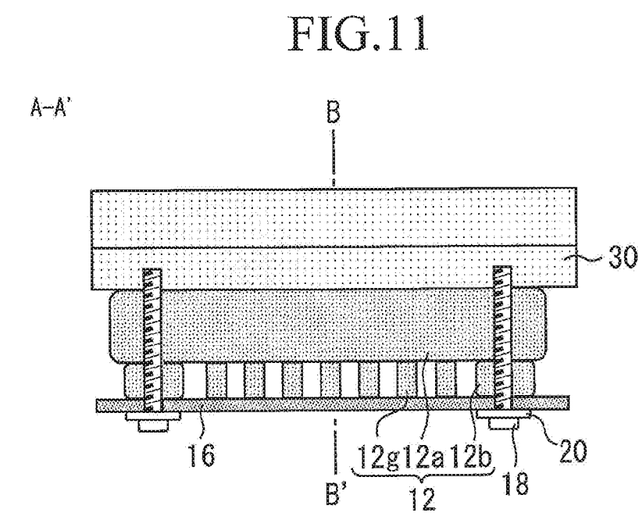
FIG. 11 is a cross-sectional view of a semiconductor apparatus according to a third embodiment.
Figure 12:
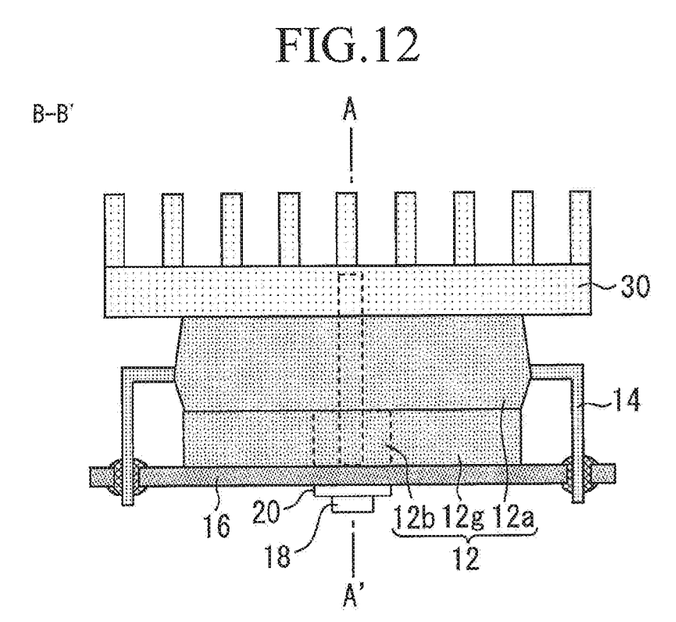
FIG. 12 is a cross-sectional view taken along line B-B' of FIG. 11.

FIG. 11 is a cross-sectional view of a semiconductor apparatus according to a third embodiment. The resin housing 12 includes at least one fin 12g protruding from the main body 12a in the same direction as the projections 12b. The fin 12g is a flat planar plate. A plurality of the fins 12g can be provided between the two projections 12b. FIG. 12 is a cross-sectional view taken along line B-B' of FIG. 11. A width of each of the fins 12g may be about the same as a width of the main body 12a. The semiconductor apparatus according to the third embodiment can dissipate heat not only from the heat sink 30 side but also from the surface of the resin housing 12.

Figure 13:
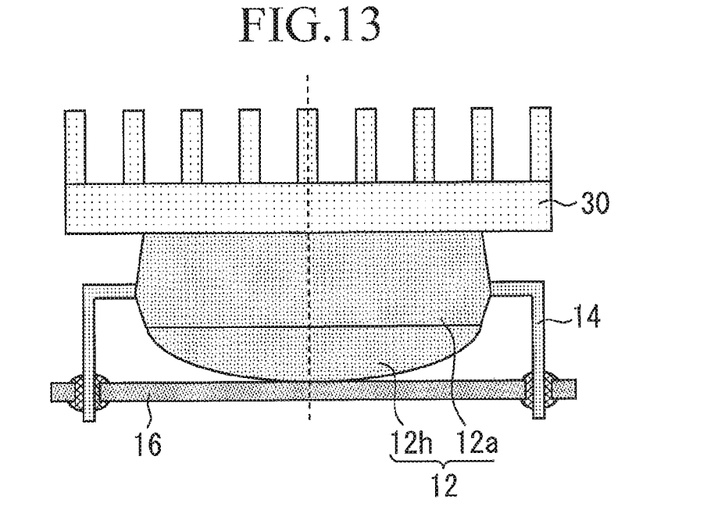
FIG. 13 illustrates a modification of a fin.

FIG. 13 illustrates a modification of a fin. A bottom surface of a fin 12h is a curved surface. The fin 12h is provided between two projections and the amount of protrusion of the fin 12h from the main body 12a is maximum on a line connecting the two projections. In FIG. 13, the two projections 12b are not shown, but a line connecting the two projections 12b is shown in a broken line. It should be noted that the line connecting between the two projections 12b can be paraphrased as a line connecting between the two through-holes 12c, and both has the same meaning.

A height of the fin 12h decreases as a distance from the broken line of FIG. 13 increases. If the bottom surface of the fin 12h is a curved surface, the surface area of the fin 12h decreases compared to the fin 12g shown in FIGS. 11 and 12, but it is possible to reduce the effect of the stress acting in a direction perpendicular to the line connecting the two through-holes 12c due to warpage or the like of the printed circuit board 16. It should be noted that while the bottom surface of the fin 12h is the curved surface as described above, the bottom surfaces of the projections 12b may be flat surfaces in order to stabilize the contact between the resin housing 12 and the printed circuit board 16.

Fourth Embodiment

Figure 14:
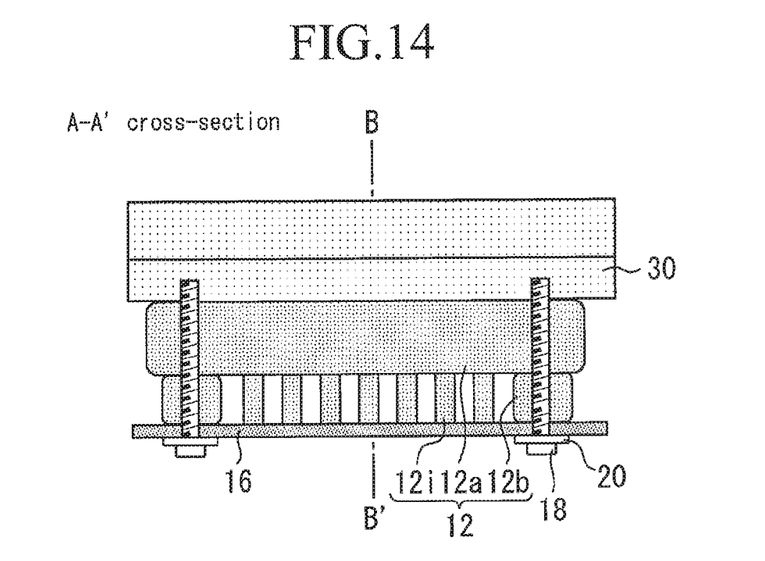
FIG. 14 is a cross-sectional view of a semiconductor apparatus according to a fourth embodiment.
Figure 15:
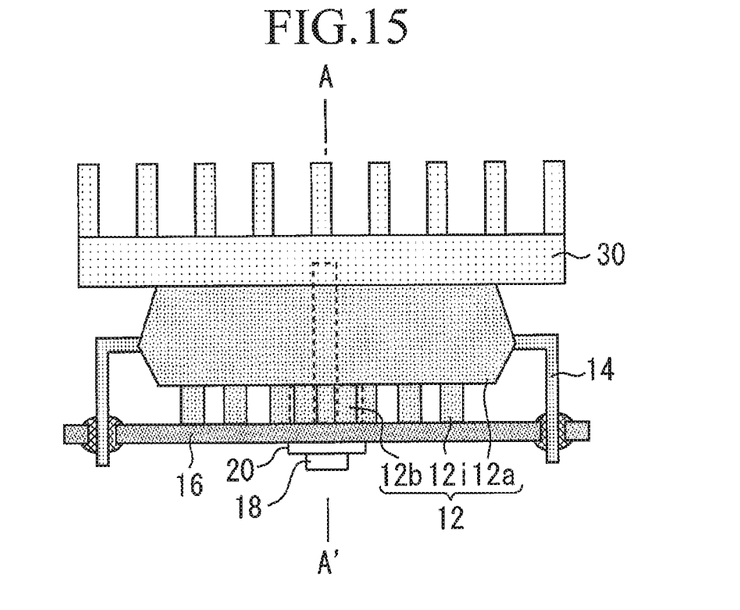
FIG. 15 is a cross-sectional view taken along line B-B' of FIG. 14.

FIG. 14 is a cross-sectional view of a semiconductor apparatus according to a fourth embodiment. The resin housing 12 includes a plurality of blocks 12i protruding from the main body 12a in the same direction as the projections 12b. The blocks 12i can be provided in a pinholder shape, for example. FIG. 15 is a cross-sectional view taken along line B-B' of FIG. 14. The plurality of blocks 12i can be provided in a direction from the near side to the far side in the sheet of FIG. 14. Providing the blocks 12l increases a heat dissipation area, thereby enhancing heat dissipation effect.

The bottom shape of the blocks 12i includes, but is not particularly limited to, square, triangle, and circle. However, by making the bottom surfaces of the blocks 12i be curved surfaces, warpage or the like of the printed circuit board 16 is prevented from exerting a large amount of stress on the power module 11.

Figure 16:
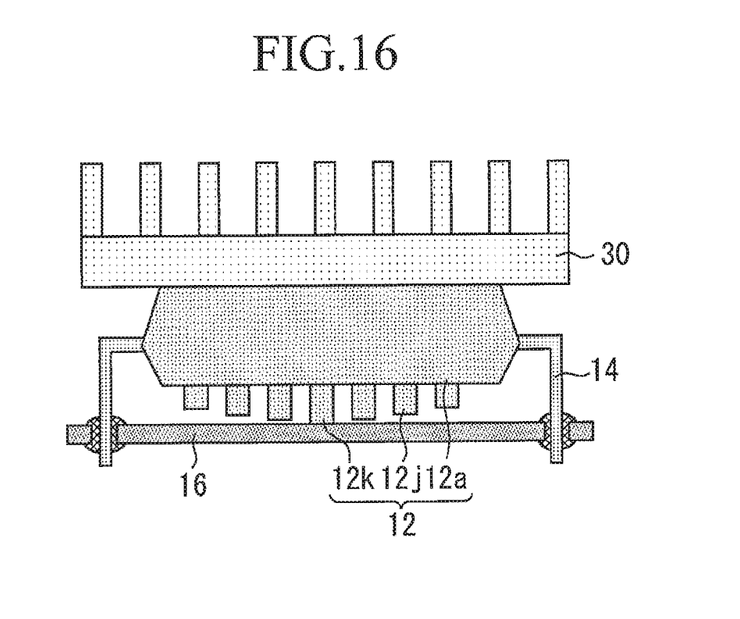
FIG. 16 is a cross-sectional view of a semiconductor apparatus according to a modification.

FIG. 16 is a cross-sectional view of a semiconductor apparatus according to a modification. The semiconductor apparatus includes two projections 12b of the same type as those mentioned above, and the amounts of protrusion of a plurality of blocks 12k from the main body 12a are maximum on a line connecting the two projections 12b. In other words, the highest blocks 12k are on the line connecting between the two through-holes 12c, and the heights of the blocks 12k decrease as a distance from the line increases. The bottom surfaces of the projections 12b may be flat surfaces. Uneven heights of the blocks 12k as described above reduce the effect of the stress due to warpage or the like of the printed circuit board 16.

The power module and the semiconductor apparatus according to each of the above-described embodiments can be used, for example, in motor control for industrial appliances or consumer appliances. The features according to each of the embodiments described herein can be used in combination with one another.

According to some examples, since a projection is provided to a resin housing to be brought into contact with a circuit board, a power module and a semiconductor apparatus that have high reliability can be obtained.

The invention claimed is:

1. A power module comprising:
a resin housing including a main body and at least one projection protruding from the main body; and
a lead terminal extending outwardly from the main body, wherein
a through-hole is provided so as to penetrate the main body and the projection.

2. The power module according to claim 1, wherein a bottom surface of the projection is a flat surface.

3. The power module according to claim 2, wherein a side surface and the flat surface of the projection are connected by a curved surface.

4. The power module according to claim 1, wherein the projection protrudes 1.5 to 2 mm or more relative to the main body.

5. The power module according to claim 1, wherein the at least one projection comprises two projections, and the resin housing includes a connecting member protruding from the main body and connecting the two projections.

6. The power module according to claim 5, wherein a width of the connecting member decreases as a distance from the projections increases in planar view.

7. The power module according to claim 6, wherein a side surface of the connecting member is a curved surface.

8. The power module according to claim 5, wherein the side surface and the bottom surface of the connecting member are connected by a curved surface.

9. The power module according to claim 5, wherein an amount of protrusion of each of the projections relative to the main body is greater than an amount of protrusion of the connecting member relative to the main body.

10. The power module according to claim 9, further comprising grease applied on the bottom surface of the connecting member.

11. The power module according to claim 1, wherein the resin housing includes a fin protruding from the main body in same direction as the projection.

12. The power module according to claim 11, wherein a bottom surface of the fin is a curved surface.

13. The power module according to claim 12, wherein the at least one projection comprises two projections, the fin is provided between the two projections, and an amount of protrusion of the fin from the main body is maximum on a line connecting the two projections.

14. The power module according to claim 1, wherein the resin housing includes a plurality of blocks protruding from the main body in same direction as the projection.

15. The power module according to claim 14, wherein a bottom surface of each of the blocks is a curved surface.

16. The power module according to claim 14, wherein the at least one projection comprises two projections, and amounts of protrusion of the blocks from the main body are maximum on a line connecting the two projections.

17. A semiconductor apparatus comprising:
a power module including
a resin housing having a main body and a projection protruding from the main body, and
a lead terminal extending outwardly from the main body, a through-hole being provided so as to penetrate the main body and the projection; and
a printed circuit board including a substrate through-hole, the lead terminal passing through the substrate through-hole, wherein
the projection is in contact with the printed circuit board.

18. The semiconductor apparatus according to claim 17, further comprising a screw passing through the through-hole and bringing the projection into close contact with the printed circuit board.

19. The semiconductor apparatus according to claim 17, wherein
a bottom surface of the projection is in contact with the printed circuit board, and
a side surface and the bottom surface of the projection are connected by a curved surface.

20. The semiconductor apparatus according to claim 18, further comprising a heat sink on an upper surface of the resin housing, the upper surface being opposite to a surface provided with the projection, wherein the screw is screwed into the heat sink, thereby bringing the upper surface into close contact with the heat sink and bringing the projection into close contact with the printed circuit board.

21. The semiconductor apparatus according to claim 17, wherein
a surface mount component is fixed to the printed circuit board right under the power module.

22. The semiconductor apparatus according to claim 17, further comprising grease between the main body and the printed circuit board.

* * * * *